United States Patent
Fang et al.

(10) Patent No.: US 6,316,323 B1
(45) Date of Patent: Nov. 13, 2001

(54) METHOD FOR FORMING BRIDGE FREE SILICIDE BY REVERSE SPACER

(75) Inventors: Edberg Fang, Yun-Lin; Wen-Yi Hsieh; Teng-Chun Tsai, both of Hsin-Chu, all of (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/532,847

(22) Filed: Mar. 21, 2000

(51) Int. Cl.⁷ .................................................. H01L 21/336
(52) U.S. Cl. ...................... 438/305; 438/299; 438/655; 438/592; 438/595
(58) Field of Search .................................... 438/197, 270, 438/289, 296, 299, 301, 303, 305, 585, 595, 655, 663, 664, 682, 683, 592

(56) References Cited

U.S. PATENT DOCUMENTS

| | | | |
|---|---|---|---|
| 5,372,968 | * 12/1994 | Lur | 437/67 |
| 5,434,093 | * 7/1995 | Chau | 437/41 |
| 5,489,543 | * 2/1996 | Hong | 437/41 |
| 5,534,447 | * 7/1996 | Hong | 437/27 |
| 5,879,998 | * 3/1999 | Krivokapic | 438/259 |
| 5,953,612 | * 9/1999 | Lin | 438/299 |
| 5,960,270 | * 9/1999 | Misra | 438/197 |
| 5,963,818 | * 10/1999 | Kao | 438/424 |
| 5,963,824 | * 10/1999 | Krivokapic | 438/593 |
| 6,025,232 | * 2/2000 | Wu | 438/270 |
| 6,025,235 | * 2/2000 | Krivokapic | 438/289 |
| 6,057,583 | * 5/2000 | Gardener | 257/408 |
| 6,087,208 | * 7/2000 | Krivokapic | 438/183 |
| 6,096,641 | * 8/2000 | Kunikiyo | 438/653 |
| 6,100,558 | * 8/2000 | Krivokapic | 257/310 |
| 6,130,454 | * 10/2000 | Gardener | 257/330 |
| 6,169,003 | * 1/2001 | Hu | 438/299 |
| 6,201,278 | * 3/2001 | Gardener | 257/330 |
| 6,204,137 | * 3/2001 | Teo | 438/305 |
| 6,214,677 | * 4/2001 | Lee | 438/284 |

* cited by examiner

Primary Examiner—Mary Wilczewski
Assistant Examiner—David Goodwin

(57) ABSTRACT

The proposed invention is used to prevent the bridging issue of salicide process and also to provide a self-aligned contacted process in conventional self-aligned silicide process. In short, the proposed invention is a two-step silicide process with a reverse spacer structure, and comprises following steps: providing a substrate; forming a pad layer on the substrate; forming a first cap layer on the pad layer; defining a trench region over the substrate and forming the trench; implanting first ions into part of the substrate that is uncovered by the first layer; forming a pair of spacers inside the trench; implanting second ions into part of the substrate that is not covered by the first layer and the spacers; forming a gate oxide layer that is located inside the trench; filling a polysilicon layer into the trench; capping a first metal layer on the polysilicon layer; performing a first rapid thermal process; removing unreacted the first metal layer; filling the trench by a second cap layer; removing the first cap layer and the pad layer that are not located inside the trench region, and then a gate structure is formed; forming a source and a drain inside the substrate; forming a second metal layer on the substrate; performing a second rapid thermal process; removing unreacted the second metal layer; performing a third rapid thermal process; forming a third cap layer on the substrate; and forming a pair of contacts inside the third cap layer.

30 Claims, 7 Drawing Sheets

METHOD FOR FORMING BRIDGE FREE SILICIDE BY REVERSE SPACER

BACKGROUND OF THE INVENTION

1. Field of the Invention

The proposed invention relates to a method for forming bridge free silicide, and more particularly to a method not only provides a self-aligned contact process in the self-aligned salicide process but also effectively reduces equivalent length of gate by a reverse spacer structure.

2. Description of the Prior Art

Silicide is an important field in contemporary semiconductor fabrication. Advantages of silicide comprise lower contact resistance, withstand high temperature and allowable of self-alignment process. Further, suicides usually are formed by reacting refractory or near noble metals with silicon. Among them are titanium silicide (TiSi2), cobalt silicide (CoSi2), tungsten silicide (Wsi2), platinum silicide (Ptsi2), molybdenum silicide (MoSi2), palladium silicide (PdSi2), and tantalum silicide (TaSi2).

However, owing to the fact that a higher temperature annealing is need to carry out those refractory metal silicide, an unavoidable issue is the bridge phenomena that means the silicide on gate is connected to the silicide on source/drain and then an unexpected short is happened. Sequentially, the bridge phenomena can be further illustrated in following paragraphs.

In conventional salicide process, metal is formed on the gate, the sidewall spacers and the source/drain regions. And then annealing processes are performed to react the metal with the polysilicon (silicon) of the gate and the silicon (polysilicon) of the source/drain to form silicide. Additional, following the first annealing process, all unreacted metal is removed.

Moreover, one of principal functions of sidewall spacers is to separate silicide on the gate from silicide on the source/drain. However, despite the incorporation of spacers, silicide also may form laterally and easily bridge the separation between the gate and the source/drain. Then the gate is shorted to the source/drain, and so-called "bridge phenomena" occurs. In addition, silicon (polysilicon) diffuses into the metal that covers the sidewall spacers and subsequently reacts with the metal.

Further, though silicide can be used to provide self-aligned process and then required precision of photolithography can be decreased. However, the decrement is finite for distance between silicide on gate and silicide on source/drain is finite. Further, in contemporary semiconductor fabrication, spacers are formed on sidewall of gate and then length of gate (critical scale) can not be further reduced to take advantage of silicide to provide excellently self-aligned process.

In summary, it is beyond any doubt that bride phenomena is serious issue in application of silicide, and then a method to take advantage of silicide is instantly required.

SUMMARY OF THE INVENTION

A principal object of the present invention is to provide a manufacturable method for preventing the phenomena issue.

Another object of the present invention is to provide a practical silicide scheme that provides a self-aligned contacted process in conventional self-aligned silicide process.

A further object of the present invention is to provide a salicide process that exploits silicide with short equivalent length of gate that is reduced by a reverse spacer structure.

Briefly, first preferred embodiment, a two-step silicide process with a reverse spacer structure, comprises following steps: providing a subs on the polysilicon layer; performing a first rapid thermal process; removing unreacted the first metal layer; filling the trench by a second cap layer; removing the first cap layer and the pad layer that are not located inside the trench region, and then a gate structure is formed; forming a source and a drain inside the substrate; forming a second metal layer on the substrate; performing a second rapid thermal process; removing unreacted the second metal layer; performing a third rapid thermal process; forming a third cap layer on the substrate; and forming a pair of contacts inside the third cap layer.

In comparison, another preferred embodiment is a method for forming transistor with bridge-free silicide and short effective gate length. The method comprises following essential steps: providing a substrate that covered by a first cap layer; forming a trench inside the first cap layer; implanting first ions into the substrate; forming a reverse spacer structure inside the trench; implanting second ions into the substrate; forming a gate structure inside the trench; forming a first silicide layer on the gate structure and then capping the first silicide layer by a second cap layer; removing first cap layer and then forming source/drain; and forming a second silicide layer on source/drain.

BRIEF DESCRIPTION OF THE DRAWINGS

In the accompanying drawing forming a material part of this description, there is shown.

DESCRIPTION OF THE PREFERRED EMBODIMENT

In order to detail explain the invention, some figures are used to illustrate essential steps of two embodiments of the proposed invention and are discussed in following paragraphs. These provided embodiments include a method for forming silicide without bridge phenomena and a method for forming transistor with both bridge-free silicide and short effective gate length.

First of all, the inventor points out that bridge phenomenon is induced by flow of silicide (or flow of silicon/polysilicon) and in conventional salicide process no silicide is totally isolated from other silicide. Thus, an essential way to prevent the bridge issue is totally isolate the silicide on gate from the silicide on source/drain.

Beside, the inventor also points out that though the geometrical length of gate is limited by available minimized scale of photolithography, but equivalent length of the gate (the distance between source and drain) can be effectively reduced by reducing the distance between doped region of source and doped region of drain. Herein, the inventor provides a method with a reverse spacer structure to accomplish the subject.

Figure 1:
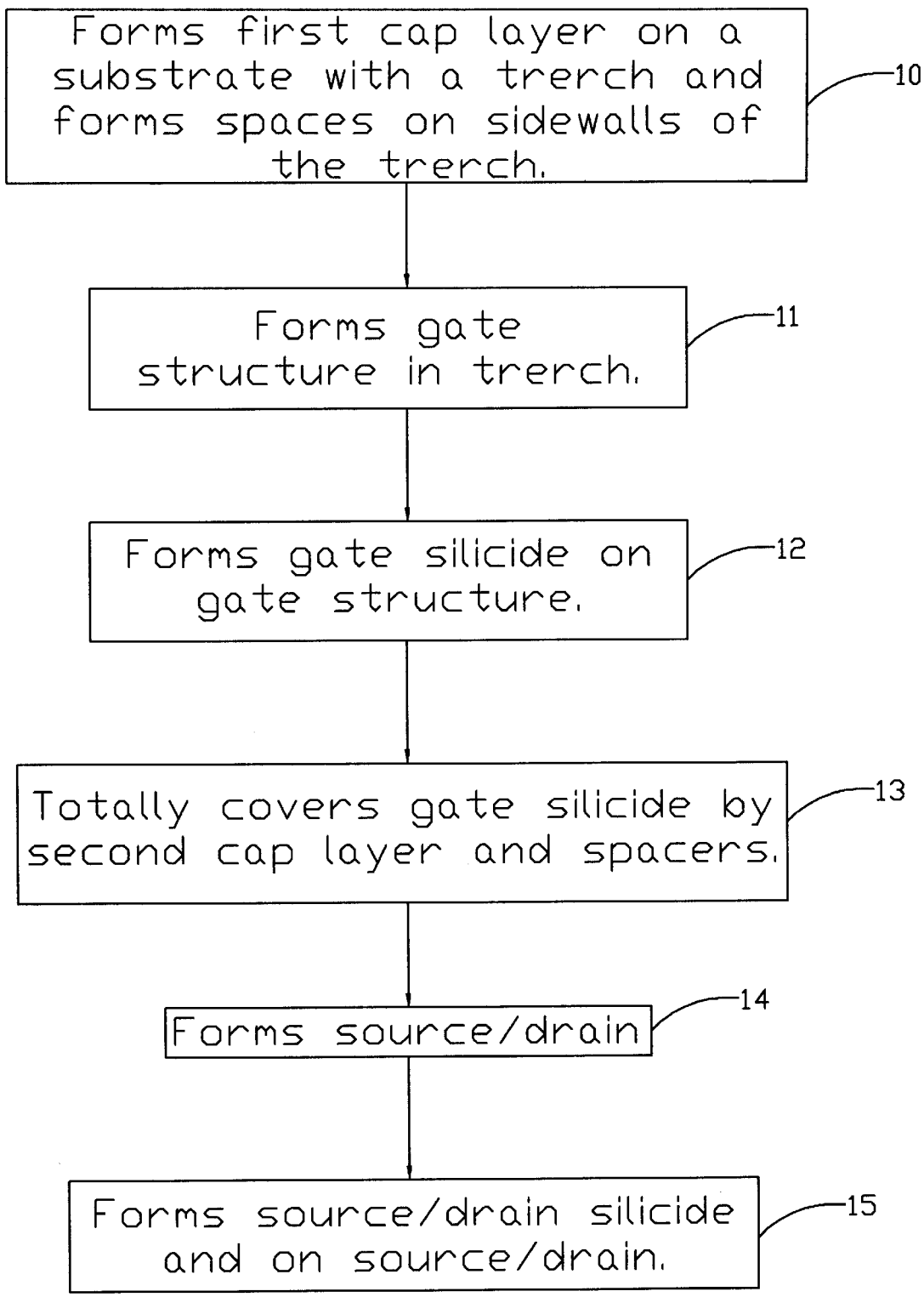
FIG. 1 is an essential flow chart of the invention.

According to previous discussion, the inventor presents a method for preventing the bridging issue. As the flow chart shown in FIG. 1, the method comprises following essential steps: First, as reverse spacer block 10 shows, forms a first cap layer on a substrate with a trench, and then forms spacers on sidewall of the trench; then, as gate block 11 shows that forms a gate structure in the trench; then as gate silicide block 12 shows that forms silicide layer on the gate structure; next as covers block 13 shows that totally covers the gate silicide by both a second cap layer and spacers; then as transistors block 14 shows that forms a source and a drain in the substrate; finally, as source/drain block 15 shows that forms other silicide layers on both source and drain.

Significantly, one main characteristic of the invention is that gate silicide is totally isolated from source/drain, and then during forming process of source/drain silicide no bridge phenomena will be appeared.

Moreover, another main characteristic of the invention is that spacers are formed inside trench where gate structure will be formed, and spacers are formed after light doped drain are formed. In other words, the equivalent length of gate can be reduced and then advantage of silicide can be further exploited.

First preferred embodiment of the present invention is a method for forming silicide without bridge phenomena. Moreover, some essential steps of the method are illustrated in following paragraph with FIG. 2A to FIG. 2I.

Figure 2A:
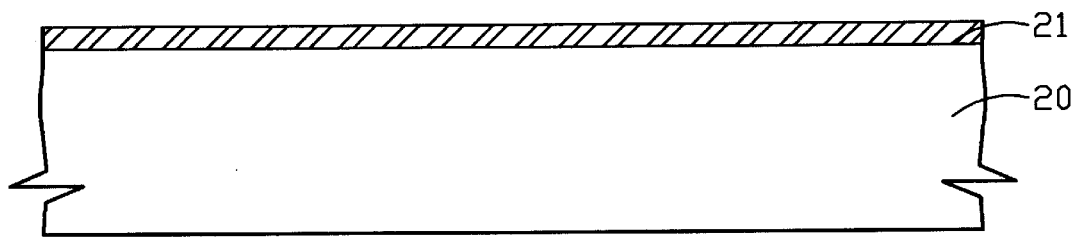
FIG. 2A to FIG. 2I are a series of qualitative cross-section illustration about essential steps of one preferred embodiment of the invention.

Referring to FIG. 2A, provides substrate 20 with pad layer 21 that is located on the substrate. Herein, substrate 20 usually comprises some structures such as isolation and well, and available varieties of isolation comprises shallow trench isolation and field oxide. And pad layer 21 usually is a pad oxide layer.

Figure 2B:
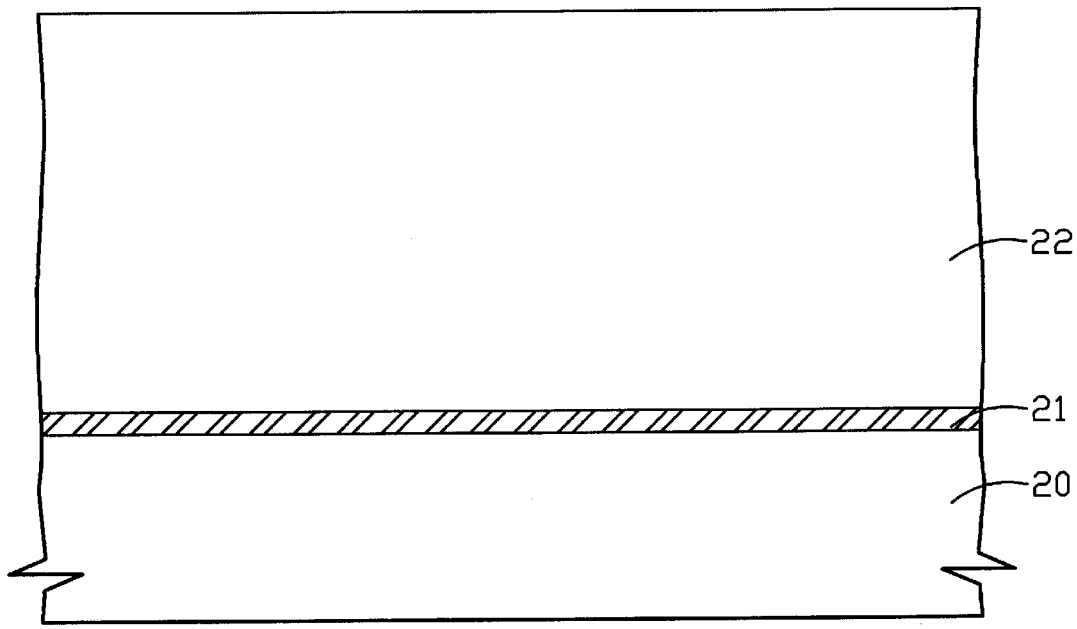

As shown in FIG. 2B, forms first cap layer 22 on pad layer 21 and then define a trench region, where the trench region is prepared to form gate in following steps.

Figure 2C:
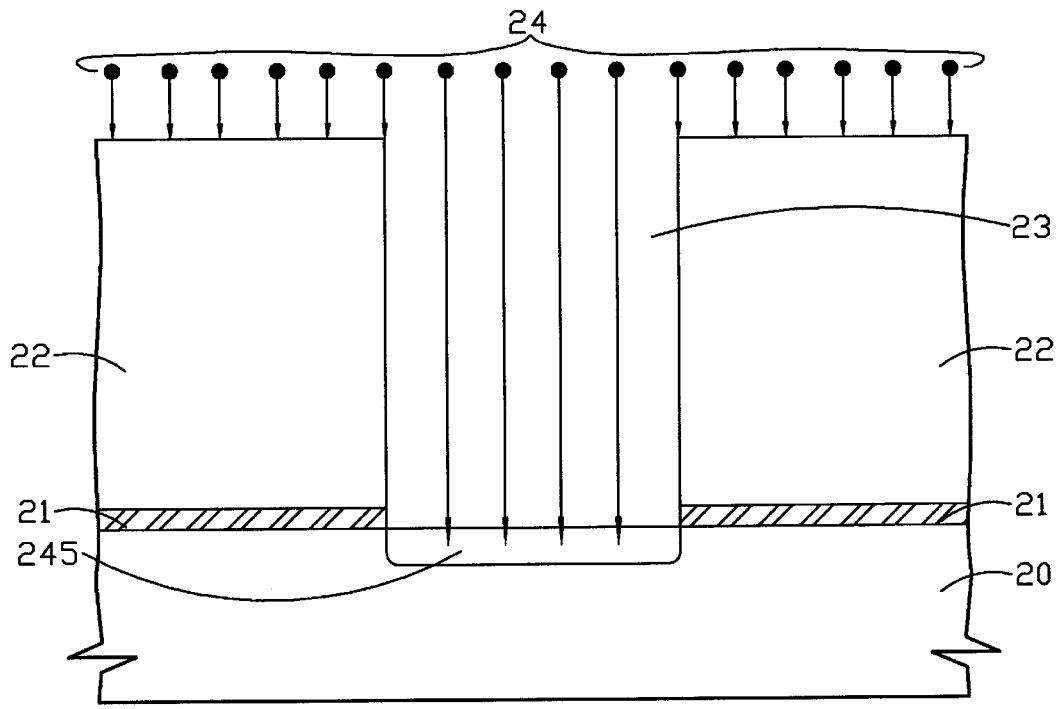

As FIG. 2C shows, forming trench 23 and then implanting first ions 24 into substrate 20. Obviously, first cap layer 22 (or pad layer 21) is an obstacles of first ions 24 and then only part of substrate 20 that is not covered by first cap layer 22 is implanted. Moreover, conductive type of first ions 24 is opposite to conductive type of substrate 20, and implanted dense is larger enough to form wall 245 that is located both in substrate 20 and under trench 23.

Figure 2D:
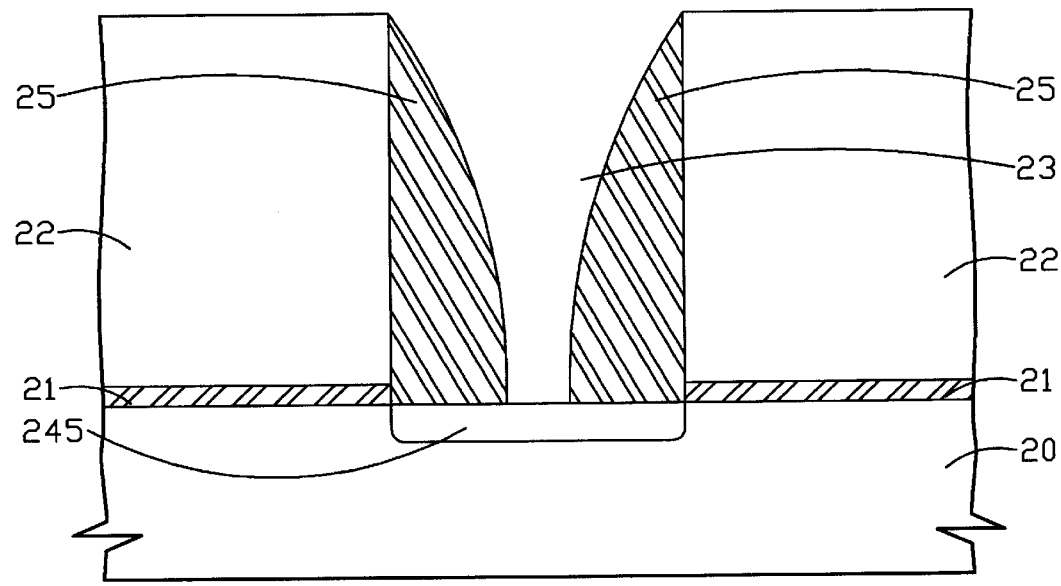
Figure 2E:
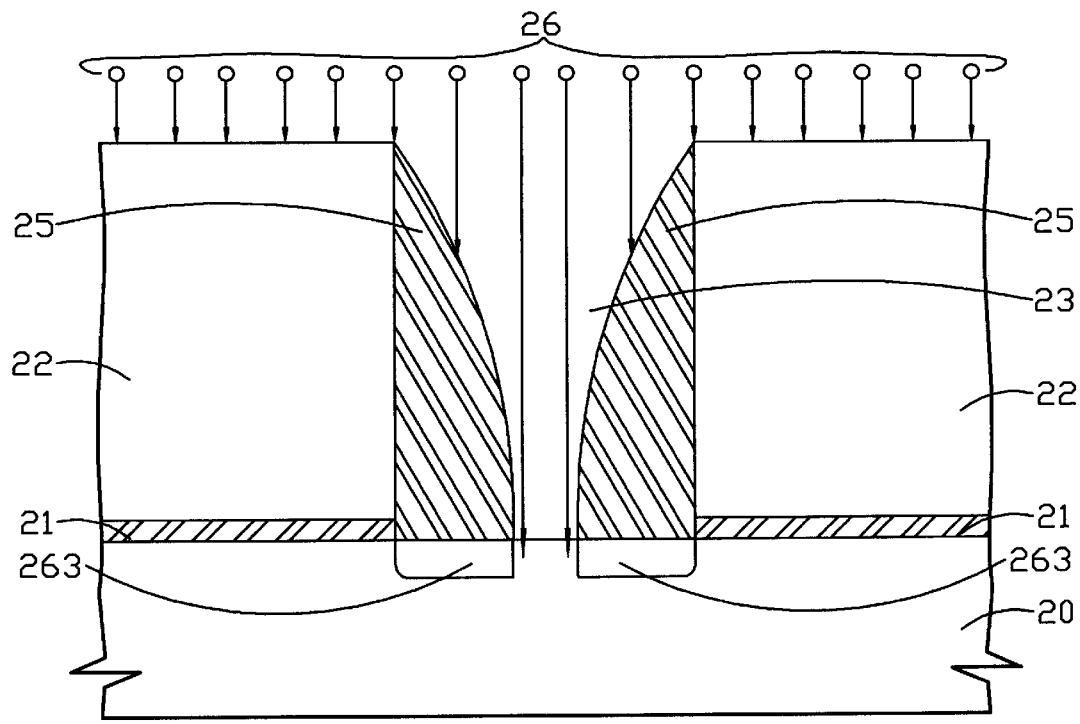

Then as shown in FIG. 2D, spacers 25 are formed on sidewalls of trench 23. And then as FIG. 2E shows that, second ions 26 are implanted into substrate 20. Obviously, both first cap layer 22 (or pad layer 21) and spacers 25 are obstacles of second ions 26 and then only part of substrate 20 that is not covered by first cap layer 22 or spacer 25 is implanted.

Additional, conductive type of second ions 26 is equal to conductive type of substrate 20, and implanted dense of second ions 26 is equal to implanted dense of first ions 24. Therefore, first ions 24 of part of wall 245 that is not covered by spacer 25 is cancelled by second ions 26 and then a significant result is that distance between first doped region 263 and second doped region 265 is shorter than width of top of trench 23.

Figure 2F:
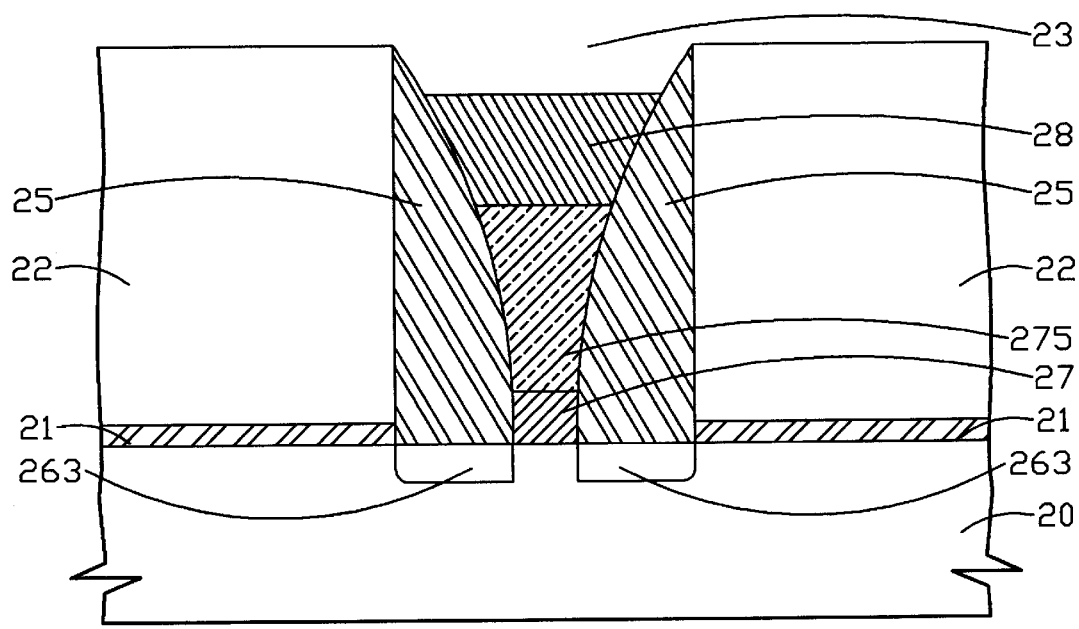

Next, as FIG. 2F shows, forms gate oxide layer 27 inside trench 23 and then fills polysilicon layer 275 into trench 23. Then caps a first metal layer on 275 polysilicon layer and perform a first rapid thermal process to form first silicide layer 28 over first polysilicon layer 275, finally removes unreacted first metal layer. In addition, FIG. 2F illustrate the case that polysilicon layer 275 not totally reacted with first metal layer, but polysilicon layer 275 also can be totally reacted with first metal layer. Whether totally reacted or not is dependent on practical receipt of salicide process. Herein, available varieties of the first metal layer comprise Titanium, Cobalt, Tungsten, Platinum, Molybdenum, Palladium and Tantalum. And temperature of the first rapid thermal process is about 500° C. to 800° C.

Figure 2G:
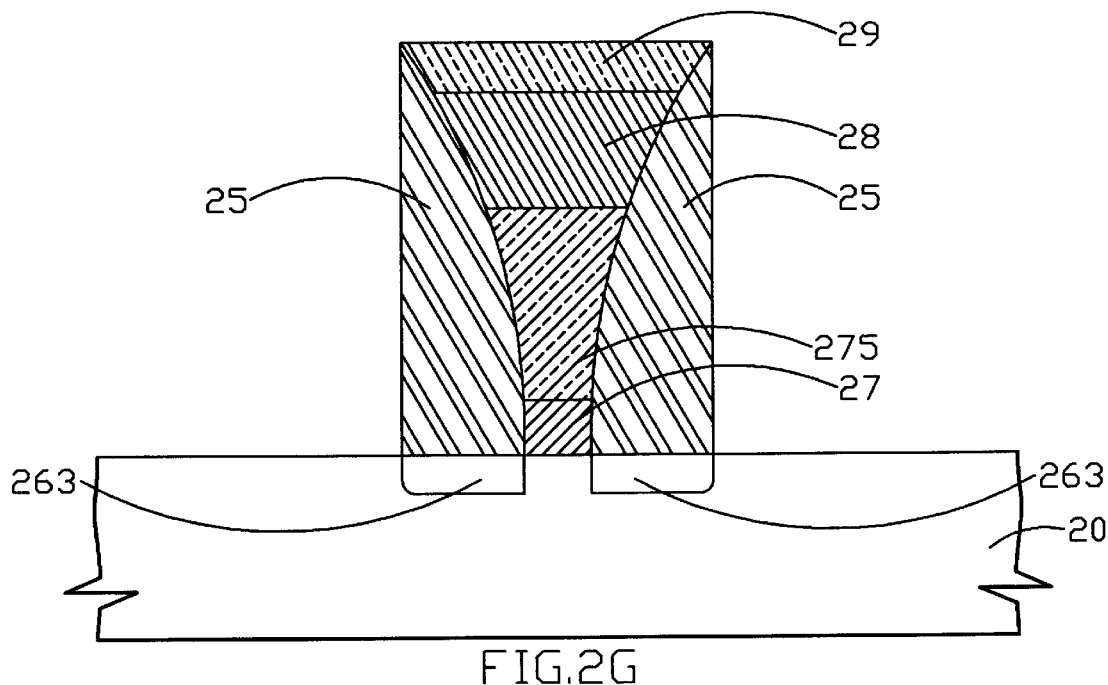

As shown in FIG. 2G, fills trench 23 by second cap layer 29 where first cap layer 22 is not covered by second cap layer 29, and whenever first cap layer 22 is covered by second cap layer 29 during fabrication, some process such as chemical mechanical polish is used to solve the problem. And then removes first cap layer 22 and pad layer 21 that are not located inside the trench region. Then a gate structure is formed.

Obviously, the etch selective ration between first cap layer 22 and second cap layer 29 should be as large as possible to make sure that first silicide layer 28 is totally covered by second cap layer 29 during removing of first cap layer 22. Herein, a typical value of the etch selective ration between first cap layer 22 and second cap layer 29 is larger than twenty.

Figure 2H:
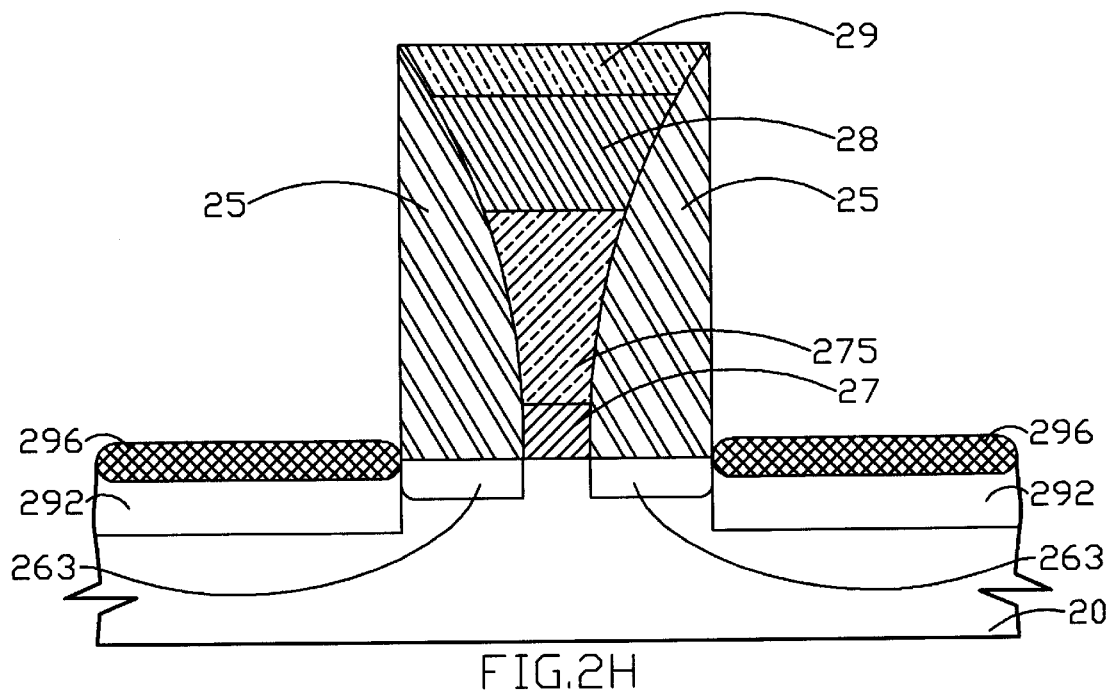

Then as shown in FIG. 2H, forms source 292 and drain 294, and then forms s second metal layer on both source 292 and drain 294. Then a second rapid thermal process is performed to form second silicide layer 296 on both source 292 and drain 294. Herein, available varieties of the second metal layer comprise Titanium, Cobalt, Tungsten, Platinum, Molybdenum, Palladium and Tantalum. And temperature of the second rapid thermal process is about 500° C. to 800° C.

Certainly, owing to the fact that salicide process usually comprises a two-step rapid thermal process. A third rapid thermal process with temperature about 800° C. to 1000° C. is performed after the second rapid thermal process. Significantly, because temperature range of third rapid thermal process is higher than both first rapid thermal process and second thermal process, an important advantage is flow of silicide, especially flow of first silicide layer 28, is effectively prevented by both second cap layer 29 and spacers 25. However, the thermal rapid thermal process is omissible, and then temperature of both first rapid thermal process and second rapid thermal process is about 500° C. to 1000° C.

In addition, the method further comprises an optional step: anneal both source 292 and drain 294 after the third rapid thermal process is finished.

Moreover, further comprising forming a pair of light doped drain inside substrate 20 before formation of source 292 and drain 294. Referring to FIG. 2C to FIG. 2H, it is crystal-clear that first doped region 263 and second doped region 265 are properly to be used as light doped drain. In other words, an oblique implantation of ions for formation of light doped drain is usually not required. However, for some specific condition, specific light doped drain such as hola is required and then an oblique implantation of ions is required.

Figure 2I:
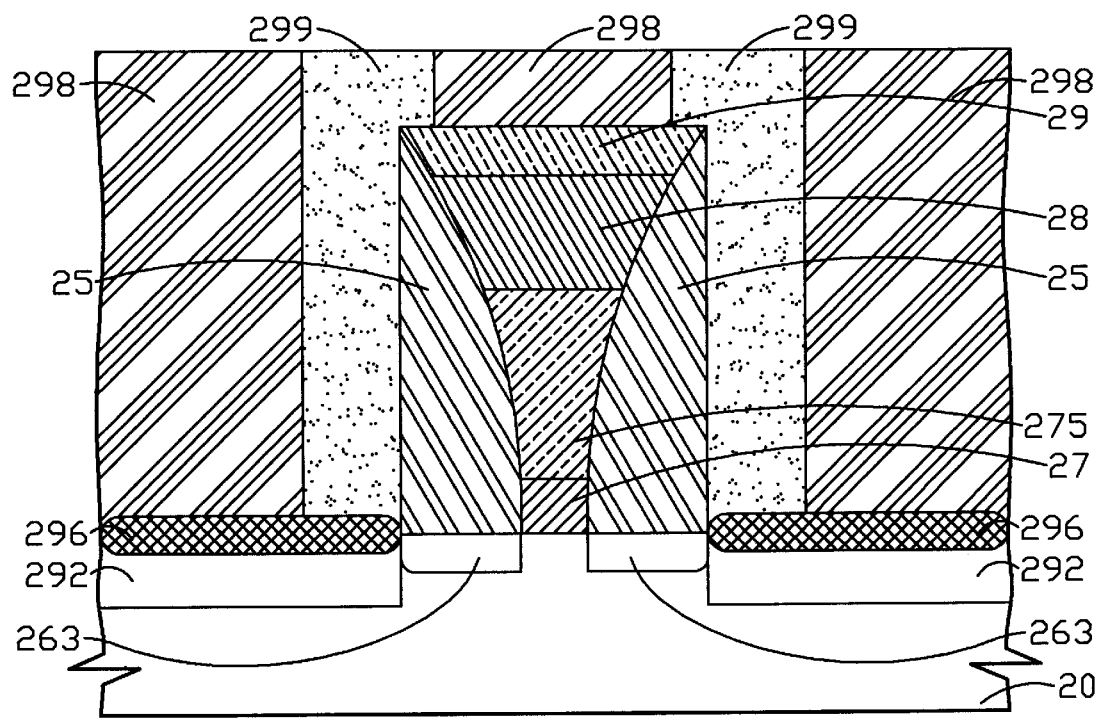

Finally, as FIG. 2I shows, third cap layer 298 is formed on substrate 20, where the gate structure also is covered by third cap layer 298. And then some contacts 299 is formed inside third cap layer 298, where contacts 299 are connected to source 292 and drain 294 separately. Again, an optional step is to planarize surface of third cap layer 298 before contacts 299 are formed, where available methods for planarizing surface of third cap layer 298 comprise chemical mechanical polish.

Figure 3:
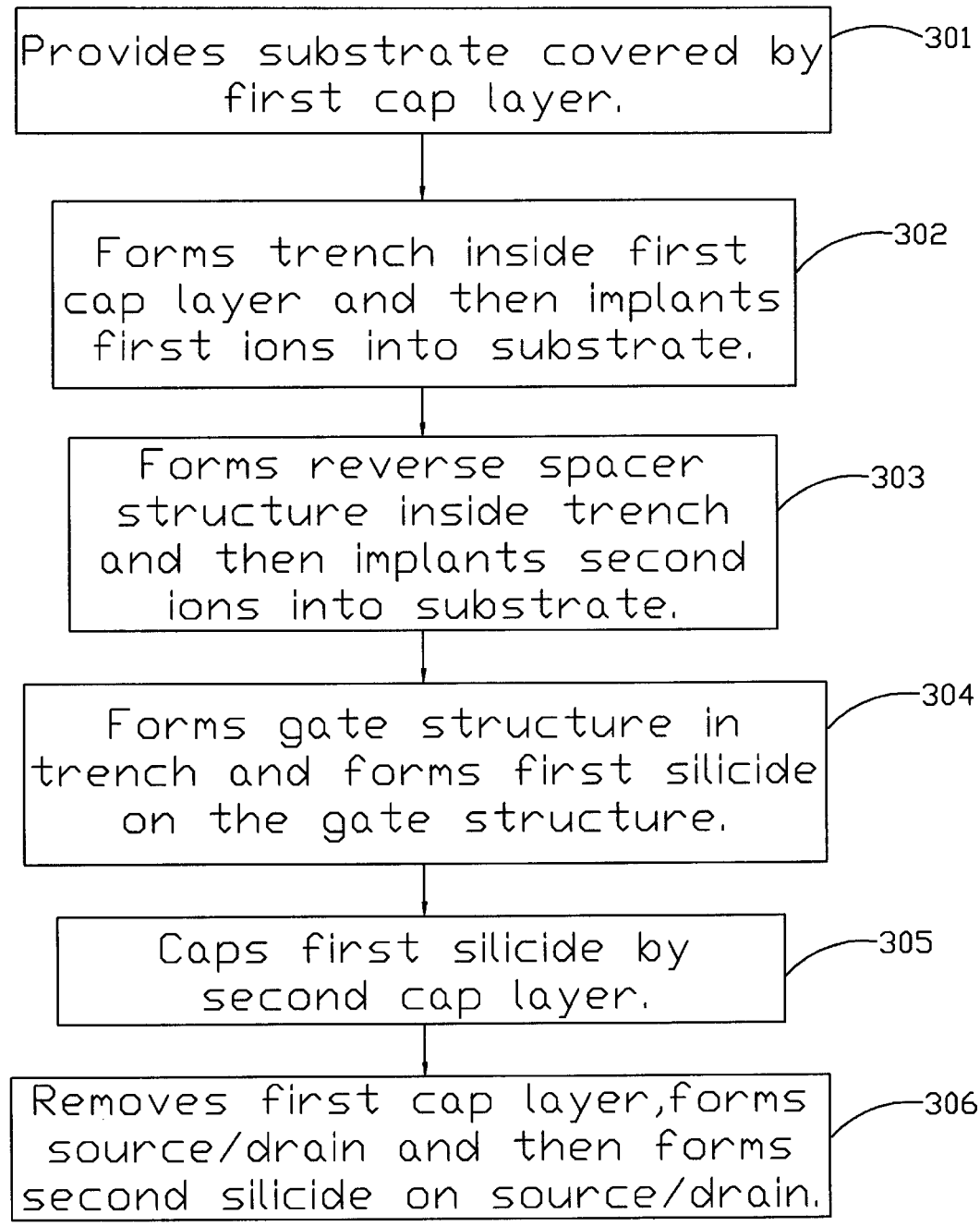
FIG. 3 is an essential flow chart of essential steps of another preferred embodiment of the invention.

In comparison, another preferred embodiment is a method for forming transistor with bridge-free silicide and short effective gate length. As FIG. 3 shows, the present method comprises following essential steps: First, as substrate block 301 shows, provides a substrate that covered by a first cap layer. Then as trench block 302 shows, forms a trench inside the first cap layer and implants first ions into the substrate. Next, as reverse spacer block 303 shows, forms a reverse spacer structure inside the trench and then implants second ions into the substrate. And then as gate silicide block 304 shows, forms a gate structure inside the trench and then forms a first silicide layer on the gate structure. Next as cap block 305 shows, caps the first silicide layer by a second cap layer. Finally, as source/drain silicide block 306 shows, removes first cap layer and forms source/drain, then forms a second silicide layer on source/drain.

Although specific embodiments have been illustrated and described, it will be obvious to those skilled in the art that various modifications may be made without departing from what is intended to be limited solely by the appended claims.

What is claimed is:

1. A method for preventing bridge issue, said method comprising following steps:

providing a substrate;

forming a pad layer on said substrate;

forming a first cap layer on said pad layer;

defining a trench region over said substrate, wherein part of said first cap layer that is inside said trench region is removed to form a trench;

implanting a plurality of first ions into part of said substrate that is uncovered by said first cap layer;

forming a pair of spacers on sidewall of said trench;

implanting a plurality of second ions into part of said substrate that is not covered by said first layer of said spacers;

forming a gate oxide layer inside said trench;

filling a polysilicon layer into said trench capping a first metal layer on said polysilicon layer;

performing a first rapid thermal process;

removing unreacted said first metal layer;

filling said trench by a second cap layer, wherein said first cap layer is not covered by said second cap layer;

removing said first cap layer and said pad layer that are not located inside said trench region, and then a gate structure is formed;

forming a source and a drain inside said substrate, wherein said source and said drain are located around said gate structure;

forming a second metal layer on said substrate;

performing a second rapid thermal process;

removing unreacted said second metal layer;

performing a third rapid thermal process;

forming a third cap layer on said substrate, wherein said gate structure is covered by said third cap layer; and forming a pair of contacts inside said third cap layer, wherein said contacts are connected to said source and said drain separately.

2. The method according to claim 1, wherein said substrate comprises a plurality of structures such as isolation.

3. The method according to claim 2, wherein said isolation comprises field oxide.

4. The method according to claim 2, wherein said isolation comprises shallow trench isolation.

5. The method according to claim 1, wherein said pad layer comprises pad oxide layer.

6. The method according to claim 1, wherein conductive type of said first ions is opposite to conductive type of said substrate.

7. The method according to claim 1, wherein conductive type of said second ions is equal to conductive type of said substrate.

8. The method according to claim 1, wherein implanted dense of said second ions is equal to implanted dense of said first ions.

9. The method according to claim 1, wherein available varieties of said first metal layer comprise Titanium, Cobalt, Tungsten, Platinum, Molybdenum, Palladium and Tantalum.

10. The method according to claim 1, wherein temperature of said first rapid thermal process is about 500° C. to 800° C.

11. The method according to claim 1, wherein etch selective ration between said first cap layer and said second cap layer is larger than twenty.

12. The method according to claim 1, further comprising forming a pair of light doped drain inside said substrate before forming said source and said drain.

13. The method according to claim 1, wherein available varieties of said second metal layer comprise Titanium, Cobalt, Tungsten, Platinum, Molybdenum, Palladium and Tantalum.

14. The method according to claim 1, wherein temperature of said second rapid thermal process is about 500° C. to 800° C.

15. The method according to claim 1, wherein temperature of said third rapid thermal process is about 800° C. to 1000° C.

16. The method according to claim 1, further comprising annealing said source and said drain after said third rapid thermal process is finished.

17. The method according to claim 1, further comprising planarizing surface of said third cap layer before said contacts are formed.

18. The method according to claim 17, wherein methods for planarizing surface of said third cap layer comprise chemical mechanical polish.

19. A method for forming transistor with bridge-free silicide and short effective gate length, said method comprises:

providing a substrate that is covered by a first cap layer;

forming a trench in said first cap layer;

implanting a plurality of first ions into part of said substrate that is not covered by said first cap layer;

forming a pair of spacers on the sidewalls of said trench;

implanting a plurality of second ions into part of said substrate that is not covered by both said first cap layer and said spacers;

forming a gate structure in said trench by filling a dielectric layer and a conductive layer in sequence, wherein material of said conductive layer can react with metal to form the silicide;

forming a first silicide layer over said dielectric layer;

forming a second cap layer on said first silicide layer;

removing said first cap layer;

forming a source and a drain is said substrate; and forming a second silicide layer on said source and said drain.

20. The method according to claim 19, further comprising forming a pap layer on said substrate before said first cap layer is formed.

21. The method according to claim 19, wherein conductive type of said first ions is opposite to conductive type of said substrate.

22. The method according to claim 19, wherein conductive type of said second ions is equal to conductive type of said substrate.

23. The method according to claim 19, wherein implanted dense of said second ions is equal to implanted dense of said first ions.

24. The method according to claim 19, wherein available varieties of said first silicide layer comprise TiSi2, CoSi2, Wsi2, PaSi2, MoSi2, PtSi2 and TaSi2.

25. The method according to claim 19, wherein temperature of required rapid thermal process for said first silicide layer is about 500° C. to 800° C.

26. The method according to claim 19, wherein etch selective ration between said first cap layer and said second cap layer is larger than twenty.

27. The method according to claim 19, wherein available varieties of said second silicide layer comprise TiSi2, CoSi2, Wsi2, PaSi2, MoSi2, PtSi2 and TaSi2.

28. The method according to claim 19, wherein temperature of required rapid thermal process for said second silicide layer is about 500° C. to 800° C.

29. The method according to claim 19, further comprising performing an additional rapid thermal process after said second silicide layer is formed.

30. The method according to claim 29, wherein temperature of said additional rapid thermal process is about 800° C. to 1000° C.

* * * * *